United States Patent
Monfray et al.

(10) Patent No.: US 10,690,947 B2
(45) Date of Patent: Jun. 23, 2020

(54) PHOTONIC DEVICES AND METHODS OF FABRICATION THEREOF

(71) Applicant: STMicroelectronics (Crolles 2) SAS, Crolles (FR)

(72) Inventors: Stephane Monfray, Eybens (FR); Frédéric Boeuf, Le Versoud (FR)

(73) Assignee: STMICROELECTRONICS (CROLLES 2) SAS, Crolles (FR)

( * ) Notice: Subject to any disclaimer, the term of this patent is extended or adjusted under 35 U.S.C. 154(b) by 0 days.

(21) Appl. No.: 16/254,753

(22) Filed: Jan. 23, 2019

(65) Prior Publication Data

US 2019/0265518 A1  Aug. 29, 2019

(30) Foreign Application Priority Data

Feb. 23, 2018  (FR) ..................... 18 51613

(51) Int. Cl.
*G02F 1/025* (2006.01)
*H01L 29/66* (2006.01)

(52) U.S. Cl.
CPC ........ *G02F 1/025* (2013.01); *H01L 29/66136* (2013.01); *G02F 2201/063* (2013.01)

(58) Field of Classification Search
None
See application file for complete search history.

(56) References Cited

U.S. PATENT DOCUMENTS

| 7,943,471 | B1 | 5/2011 | Buller et al. |
| 2010/0219450 | A1 | 9/2010 | Kim et al. |
| 2016/0313577 | A1 | 10/2016 | Sun et al. |

FOREIGN PATENT DOCUMENTS

EP  3255480 A1  12/2017

OTHER PUBLICATIONS

Kim, Younghyun et al., "Numerical Analysis of Carriers-Depletion Strained SiGe Optical Modulators With Vertical p-n Junction," IEEE Journal of Quantum Electronics, IEEE Service Center, Piscataway, NJ, USA, vol. 51, No. 4, Apr. 2015, 8 pages.

*Primary Examiner* — Jerry Rahll
(74) *Attorney, Agent, or Firm* — Slater Matsil, LLP

(57) ABSTRACT

In one aspect, a photonic device includes a first region having a first doping type, where the first region is divided into an upper portion made of silicon-germanium and a lower portion made of silicon. The device further includes a second region having a second doping type. The first region and the second region contact to form a vertical PN junction.

20 Claims, 3 Drawing Sheets

PHOTONIC DEVICES AND METHODS OF FABRICATION THEREOF

CROSS-REFERENCE TO RELATED APPLICATIONS

This application claims priority to French Application No. 18/51613, filed on Feb. 23, 2018, which application is hereby incorporated herein by reference.

TECHNICAL FIELD

The present invention relates generally to semiconductor devices, and, in particular embodiments, to photonic devices and methods of fabrication thereof.

BACKGROUND

The present disclosure generally concerns the manufacturing of electronic components, and more particularly the forming of PN junctions. The present disclosure more particularly applies to PN junctions used in light signal modulators.

Optical fibers enable transferring data in the form of light signals which are then converted into electric signals.

Each optical fiber is associated, upstream in the transmission direction, with a modulator and, downstream, with a photodiode. The modulator enables to modulate a characteristic of the light signal transmitted in the optical fiber so that it is representative of the data to be transmitted.

FIG. 1 schematically shows a modulator 10. Modulator 10 receives at a first input 12 a light signal supplied by a constant source. The modulator further comprises terminals 14 and 16 having a voltage V applied therebetween. In the example of FIG. 1, terminal 14 is coupled to a source of application of a potential V, and terminal 16 is coupled to ground. Modulator 10 supplies an output 18 with a light signal having its phase shift φ(V) depending on voltage V.

Voltage V for example varies between a high voltage representing a logic value 1 and a low value representing a logic value 0. Voltage V, and thus the phase shift of light signal φ(V), are then representative of data in binary format.

SUMMARY

In accordance with an embodiment of the present invention, a photonic device comprises a first region having a first doping type, where the first region is divided into an upper portion made of silicon-germanium and a lower portion made of silicon. The device further includes a second region having a second doping type, where the first region and the second region contact to form a vertical PN junction.

In yet another embodiment, a photonic device comprises a first trench disposed in a first region of a substrate, where the first region having a first doping type, and a second trench disposed in a second region of a substrate. The second region has a second doping type opposite to the first doping type. The second trench is parallel to the first trench. The device includes a ridge region disposed between the first trench and the second trench, where the ridge region comprises a first portion of the first region and a second portion of the second region. A silicon germanium region and a silicon region are disposed in the first portion of the ridge region. The silicon germanium region is disposed over the silicon region. The silicon germanium region and the silicon region contact the second region to form a vertical PN junction.

In yet another embodiment, a method of manufacturing a photonic device includes forming a first region having a first doping type, where the first region comprises an upper portion made of silicon-germanium and a lower portion made of silicon. The method further includes forming a second region having a second doping type, the first region and the second region contacting to form a vertical PN junction.

In yet another embodiment, a method of manufacturing a photonic device comprise forming a first trench in a first region of a substrate and a second trench in a second region of the substrate, where the first trench and the second trench delimit a ridge region. The method includes doping a first portion of the ridge region and the first region with a doping of a first doping type and doping a second portion of the ridge region and the second region with a doping of a second doping type. The method further includes forming a cavity in the first portion of the ridge region, and forming an embedded epitaxial region of the first doping type in the cavity.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
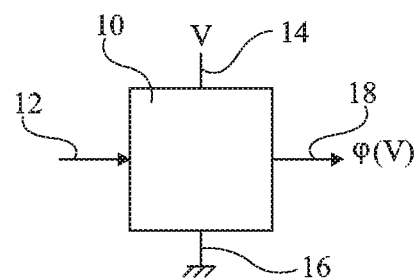
FIG. 1, previously described, is a simplified representation of a light signal modulator.

An embodiment provides a vertical PN junction comprising first region divided into an upper portion made of silicon germanium and a lower portion made of silicon.

According to an embodiment, the first region is of a first conductivity type.

According to an embodiment, the first conductivity type is type P.

According to an embodiment, the first region is in contact with a second region, of a second conductivity type.

According to an embodiment, the second region is totally made of silicon.

According to an embodiment, the first region is electrically coupled to a contacting area via a third region and the second region is electrically coupled to another contacting area via a fourth region.

According to an embodiment, the third region is doped with the first conductivity type and the fourth region is doped with the second conductivity type.

Another embodiment provides a modulator comprising a PN junction such as previously described.

According to an embodiment, the modulator is a light signal modulator.

Another embodiment provides a method of manufacturing a vertical PN junction comprising a first region having an upper portion made of silicon-germanium and a lower portion made of silicon.

According to an embodiment, the method comprises a step of etching a cavity, the bottom of the cavity being formed of silicon.

According to an embodiment, the method comprises a step of epitaxial growth of silicon-germanium in the cavity.

According to an embodiment, the method comprises steps of doping the first region of a first conductivity type and a second region, of a second conductivity type, in contact with the first region.

The foregoing and other features and advantages will be discussed in detail in the following non-limiting description of specific embodiments in connection with the accompanying drawings.

The same elements have been designated with the same reference numerals in the various drawings and, further, the various drawings are not to scale. For clarity, only those steps and elements which are useful to the understanding of the described embodiments have been shown and are detailed.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., it is referred to the orientation of the concerned elements in the drawings. The terms "approximately", "about", and "substantially" are used herein to designate a tolerance of plus or minus 10%, preferably of plus or minus 5%, of the value in question.

Unless otherwise specified, when reference is made to two elements connected together, this means that the elements are directly connected with no intermediate element other than conductors, and when reference is made to two elements coupled together, this means that the two elements may be directly coupled (connected) or coupled via one or a plurality of other elements.

Figure 2:
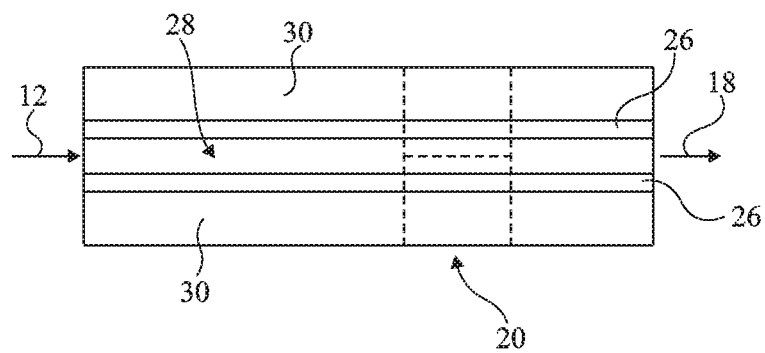
FIG. 2 is a top view of an example of a light signal modulator within a waveguide.
Figure 3:
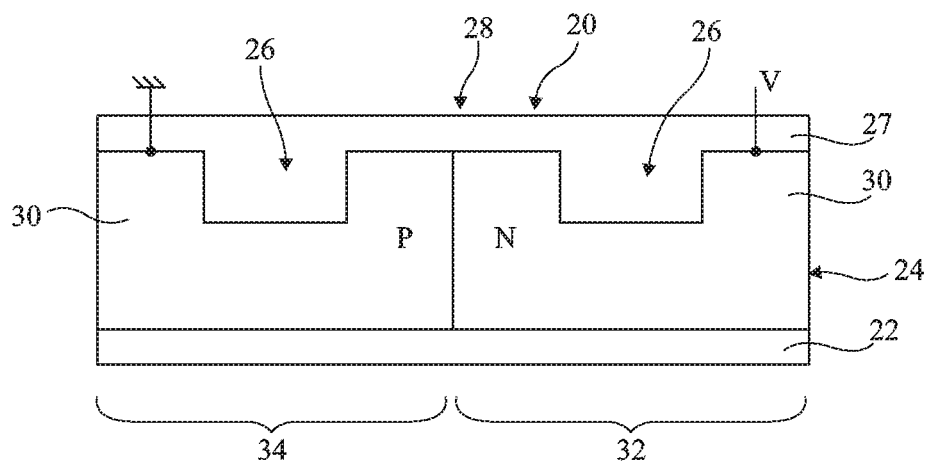
FIG. 3 is a simplified cross-section view along plane B-B of the converter of FIG. 2.

FIGS. 2 and 3 respectively are a top view of an example of a modulator 20 within a waveguide and a cross-section view along plane B-B of FIG. 2.

A substrate, not shown, for example, made of silicon, is covered with an insulator layer 22 (FIG. 3). Layer 22 is covered with a layer 24 of a semiconductor material, preferably made of silicon. Trenches 26 are formed in layer 24. Trenches 26 are filled with insulator. An insulator layer 27 (not shown in FIG. 2), preferably made of silicon oxide or of silicon nitride, covers layer 24.

A region 28 is horizontally delimited by trenches 26 and vertically delimited by layers 22 and 27. Each trench 26 is further located between region 28 and a region 30, located at the periphery of layer 24. The height of trenches 26 is smaller than the thickness of layer 24. Region 28 forms the region of the waveguide where the light signals propagate. One end of region 28 of the waveguide corresponds to input 12 and the other corresponds to output 18. The light signals thus propagate in region 28 from input 12 to output 18. The silicon is transparent for the considered wavelengths and the insulator of trenches 26 and of layers 22 and 27 is selected to have a refraction index sufficiently different from that of silicon to contain the light signal. For example, trenches 26 and layers 22 and 27 are made of silicon oxide, having a 1.45 refraction index, while that of silicon is 3.5.

Insulating trenches, not shown, are located at the level of the outer sides of regions 30. Such trenches reach layer 22 to individualize the modulator with respect to other neighboring components.

A section of the waveguide, delimited by dotted lines in FIG. 2, forms modulator 20. This section comprises first 32 and second 34 regions in contact with each other in region 28 and each comprising one of regions 30. Region 32 (at the top of FIG. 2 and on the right-hand side in FIG. 3) is N-type doped and is coupled by its region 30 to a source of application of a potential V. Region 34 (at the bottom of FIG. 2 and on the left-hand side of FIG. 3) is P-type doped and is coupled to ground. Thus, modulator 20 comprises a PN junction, forming the active area, on the path of the light signals propagating between input 12 and output 18.

The variation of phase shift $\varphi(V)$ is obtained by varying the optical index of the silicon in the active area. Such an optical index variation is obtained by varying voltage V.

For example, in current technologies, the applied voltages are for example in the range from 0 V to 2.5 V for a phase-shift in the range from 10°/mm to 25°/mm.

It is desired to be able to decrease the values of the voltages used to obtain same phase-shift ranges.

Figure 4:
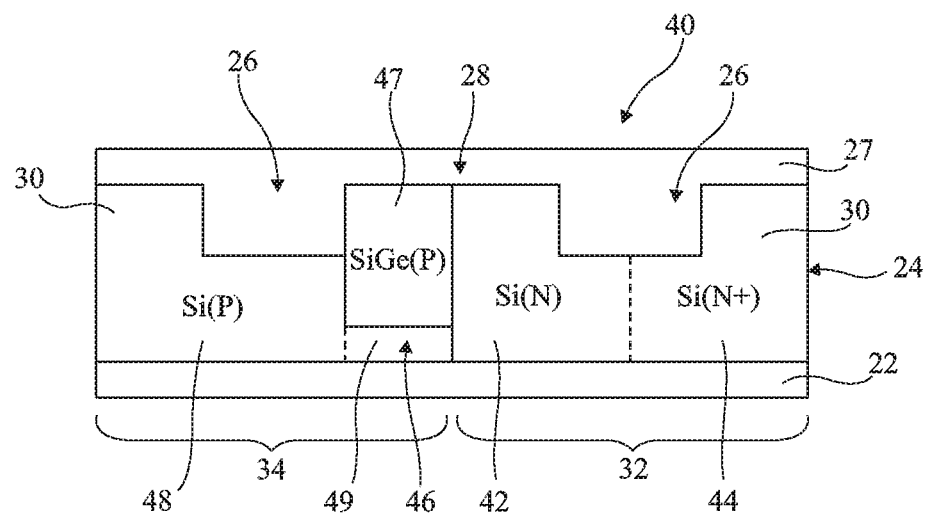
FIG. 4 is a cross-section view illustrating an embodiment of a light signal modulator.

FIG. 4 is a cross-section view illustrating an embodiment of a light signal modulator 40. Modulator 40 is located within a waveguide similar to that where modulator 20 is located. Modulator 40 thus comprises, like modulator 20, insulator layer 22 located on the substrate, not shown, and layer 24 of semiconductor material, preferably made of silicon, on layer 22. The modulator further comprises trenches 26 delimiting regions 28 and 30.

N-type doped region 32 (on the right-hand side of FIG. 4) comprises a region 42 (Si(N)) and a region 44 (Si(N+)). Region 42 is at least partially located on the path of the light signals. Region 44 is more heavily doped than region 42 and comprises region 30. Region 42 is electrically coupled to contacting areas, not shown, and to a source of application of a potential V by region 44.

The doping of region 42 is for example in the range from $10^{17}$ cm$^{-3}$ to $3 \cdot 10^{18}$ cm$^{-3}$. The doping of region 44 is for example in the range from $5 \cdot 10^{18}$ cm$^{-3}$ to $5 \cdot 10^{19}$ cm$^{-3}$.

P-type doped region 34 (on the left-hand side of FIG. 4) comprises a region 46 in contact with region 42, on the path of the light signals, and a region 48 (Si(P)) comprising region 30. Region 46 is coupled to contacting areas, not shown, and to ground, by region 48.

According to an embodiment, region 46 comprises an upper portion 47 made of silicon-germanium (SiGe(P)) and a lower portion 49 made of the material of region 48, preferably made of silicon.

The doping of region 46 (region 47 and region 49) is for example in the range from $10^{17}$ cm$^{-3}$ to $3 \cdot 10^{18}$ cm$^{-3}$. The doping of region 48 is for example in the range from $5 \cdot 10^{18}$ cm$^{-3}$ to $5 \cdot 10^{19}$ cm$^{-3}$.

The height of portion 49 is for example in the range from approximately 2% to approximately 50% of the height of layer 24, preferably from 10% to 20%. For example, portion 47 has a height in the range from approximately 50 nm to 300 nm, and portion 49 has a height in the range from 5 nm to 150 nm.

The contacting areas, not shown, for example comprise contact pads on regions 30, and vias crossing layer 27 to reach the pads.

The contacting area between regions 32 and 34, that is, between region 46 and region 42, substantially corresponds to a vertical plane, that is, a plane orthogonal to the lower surface of layer 24. A vertical PN junction is thus defined as a PN junction having a substantially vertical contacting area between the N-type doped region and the P-type doped region. In the embodiment of FIG. 4, the junction is exclusively vertical, that is, it comprises no area in another plane. In particular, the junction comprises no L-shaped junction.

The inventors have determined that, for a same range of voltages V applied between regions 30, the range of phase shifts corresponding to the embodiment of FIG. 4 is wider, for example, substantially twice as wide, than the phase shift range in the case of a structure such as that described in FIGS. 2 and 3. In other words, to obtain a given phase shift range, the voltages to be used are lower in the embodiment of FIG. 4 than in the example of FIGS. 2 and 3. More particularly, for a same range of applied voltages V, the quotient of the phase shift range to the loss range is for example substantially equal to 2.5 for a silicon PN junction, and for example substantially equal to 5.4 for a silicon and silicon-germanium PN junction.

Thus, an advantage of the embodiment of FIG. 4 over the example of FIGS. 2 and 3 is that it consumes less power to obtain the same light signal phase shifts.

It could have been chosen to form a silicon germanium layer, for example, P-type doped, on a silicon PN junction such as that of FIG. 3. However, the PN junction would then be L shaped and would be longer than in the case of a vertical junction such as that of FIG. 2. The capacitance of the junction would then be higher. Further, only a portion of the junction would be made of SiGe. The range of voltages used for a same phase shift range would then be higher than that used for the embodiment of FIG. 4. With a greater capacitance, the speed of the component is degraded and its cut-off frequency is decreased.

FIGS. 5A to 5D are cross-section views illustrating manufacturing steps of the modulator of FIG. 4.

Figure 5A:
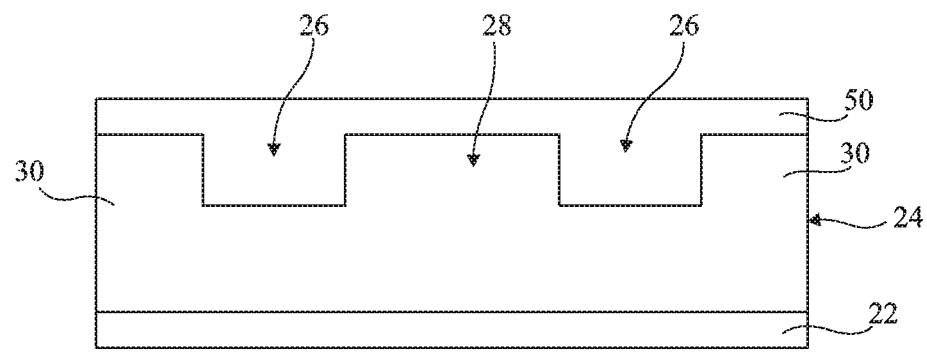
FIGS. 5A to 5D are cross-section views illustrating manufacturing steps of the modulator of FIG. 4.

FIG. 5A illustrates a step during which insulator layer 22 is formed on the substrate, not shown. Layer 24 of semiconductor material is formed on layer 22.

Trenches 26 are then formed in layer 24 to delimit region 28, between them, and regions 30, at the periphery. An insulator layer 50 is then formed on layer 24. The thickness of layer 50 is selected so that it fills trenches 26 and covers layer 24.

Figure 5B:
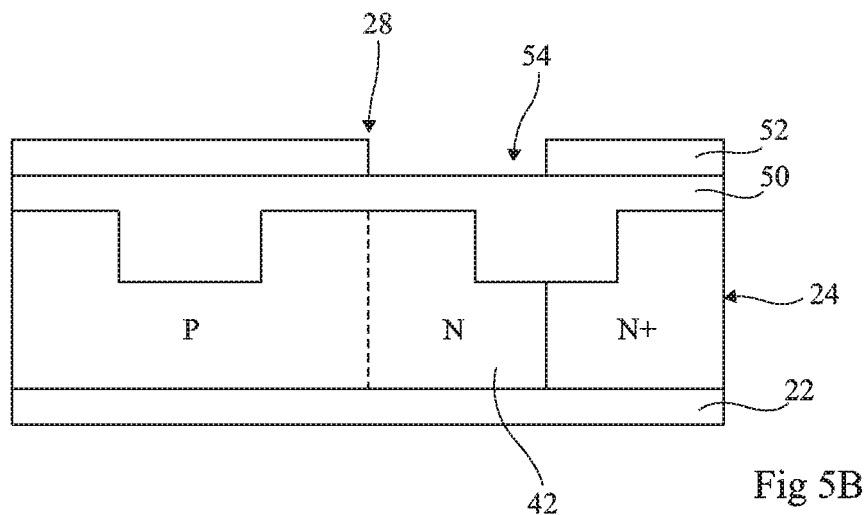

FIG. 5B is a subsequent step during which a mask 52 is formed on layer 24. Mask 52 comprises an opening 54 opposite a portion of layer 24 where region 42 is desired to be formed. The portion where region 42 is desired to be formed is then N-type doped through opening 54.

Regions 44, 46, 49, and 48 are then doped.

Figure 5C:
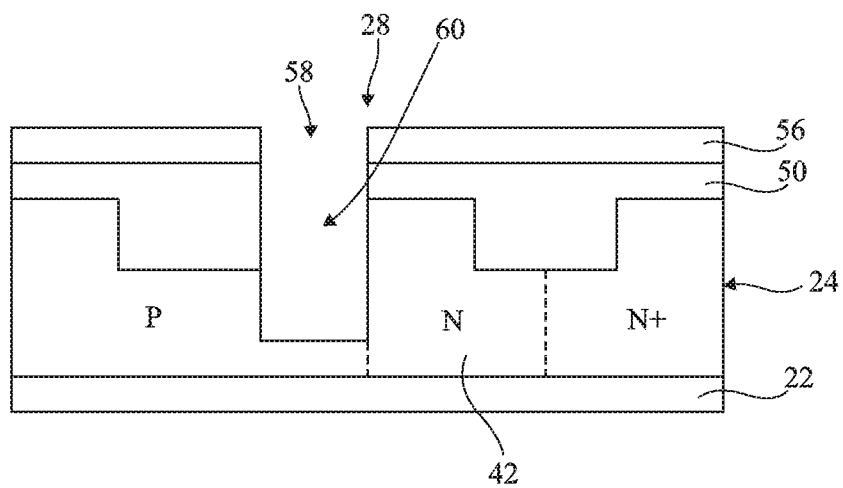

FIG. 5C illustrates a step during which mask 52 is removed and a mask 56 is formed on layer 50. Mask 56 comprises an opening 58 opposite a portion of layer 24 where region 46 is desired to be formed.

A cavity 60 is then etched in layer 24 through opening 58. The dimensions of cavity 60 substantially correspond to the desired dimensions of portion 47 of region 46. Thus, cavity 60 does not reach insulator layer 22 and the portion of layer 24 located under cavity 60 forms portion 49.

Figure 5D:
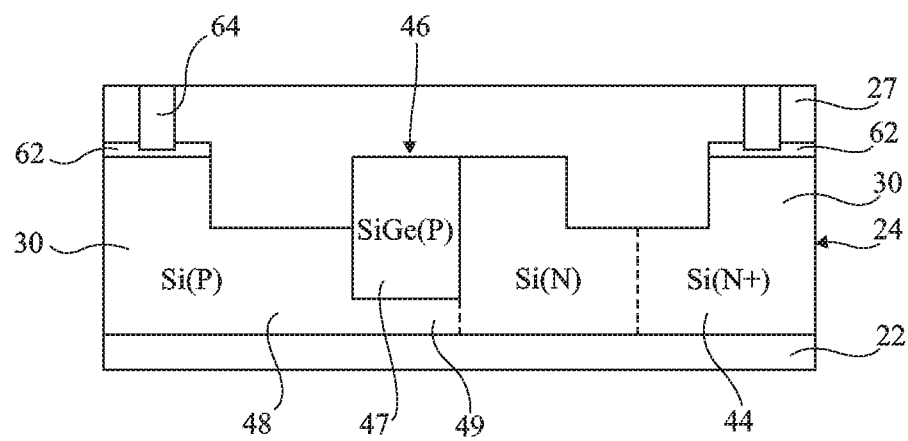

FIG. 5D illustrates a step during which mask 56 is removed.

Cavity 60 is then filled with in situ P-type doped SiGe. The method used is a selective epitaxy of SiGe. The SiGe for example has a doping in the range from approximately 10% to 40%, preferably 30%. A step of selective etching of the SiGe over the silicon and the silicon oxide may then be carried out to equalize the height of SiGe portion 47 (P) with respect to silicon region 42 (N).

An insulator layer is then formed on layer 50 to form insulator layer 27.

Connection pads 62 are formed on regions 30 and vias 64 cross layer 27 to reach pads 62. It is thus possible to apply a voltage between regions 30 via vias 64 and pads 62.

An advantage of this embodiment is that portion 49 allows a faster growth of silicon-germanium in cavity 60.

Specific embodiments have been described. Various alterations, modifications, and improvements will readily occur to those skilled in the art. In particular, the P and N doping types may be reversed.

Further, it is possible for the contacting areas to all be connected to sources of application of voltages and for none of them to be grounded.

Various embodiments with different variations have been described hereabove. It should be noted that those skilled in the art may combine various elements of these various embodiments and variations without showing any inventive step.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A photonic device comprising:
    a first region having a first doping type, the first region being divided into an upper portion made of silicon-germanium and a lower portion made of silicon; and
    a second region having a second doping type, the first region and the second region contacting to form a vertical PN junction, wherein the vertical PN junction comprises a first vertical PN junction between the upper portion and a first portion of the second region and a second vertical PN junction between the lower portion and a second portion of the second region, wherein the first vertical PN junction physically contacts the second vertical PN junction and are both disposed on a same vertical plane.

2. The device of claim 1, wherein the photonic device is a modulator.

3. The device of claim 1, wherein the second region is made of silicon.

4. The device of claim 1, wherein the first region is electrically coupled to a contacting area via a third region and the second region is electrically coupled to another contacting area via a fourth region.

5. The device of claim 4, wherein the third region is doped with the first doping type and the fourth region is doped with the second doping type.

6. A photonic device comprising:
    a first trench disposed in a first region of a substrate, the first region having a first doping type;
    a second trench disposed in a second region of a substrate, the second region having a second doping type opposite to the first doping type, the second trench being parallel to the first trench;
    a ridge region disposed between the first trench and the second trench, the ridge region comprising a first portion of the first region and a portion of the second region;
    a silicon germanium region disposed in the first portion of the ridge region; and
    a silicon region disposed underneath the silicon germanium region, the silicon germanium region and the silicon region contacting the second region to form a vertical PN junction, wherein the vertical PN junction comprises a first vertical PN junction between the silicon germanium region and an upper portion of the second region and a second vertical PN junction between the silicon region and a lower portion of the second region, wherein the first vertical PN junction physically contacts the second vertical PN junction and are both disposed on a same vertical plane.

7. The device of claim 6, further comprising an insulator layer covering the first trench and the second trench and extending between the first trench and the second trench.

8. The device of claim 6, wherein the silicon germanium region extends deeper into the first region than a bottom surface of the first trench.

9. The device of claim 6, wherein the second region comprises a first doped region and a second doped region that is more heavily doped than the first doped region.

10. The device of claim 9, wherein the first doped region and the silicon germanium region form part of the vertical PN junction.

11. A method of manufacturing a photonic device, the method comprising:
   forming a first region having a first doping type, the first region comprising an upper portion made of silicon-germanium and a lower portion made of silicon; and
   forming a second region having a second doping type, the first region and the second region contacting to form a vertical PN junction, wherein the vertical PN junction comprises a first vertical PN junction between the upper portion and a first portion of the second region and a second vertical PN junction between the lower portion and a second portion of the second region, wherein the first vertical PN junction physically contacts the second vertical PN junction and are both disposed on a same vertical plane.

12. The method of claim 11, wherein forming the first region comprises etching a cavity in a region adjacent the second region, wherein a bottom of the cavity is formed of silicon.

13. The method of claim 12, further comprising epitaxially growing silicon-germanium in the cavity.

14. The method of claim 11, further comprising doping the first region to the first doping type and the second region to the second doping type.

15. A method of manufacturing a photonic device, the method comprising:
   forming a first trench in a first region of a substrate and a second trench in a second region of the substrate, the first trench and the second trench delimiting a ridge region;
   doping a first portion of the ridge region and the first region with a doping of a first doping type;
   doping a second portion of the ridge region and the second region with a doping of a second doping type;
   forming a cavity in the first portion of the ridge region; and
   growing an embedded epitaxial region of the first doping type in the cavity.

16. The method of claim 15, further comprising:
   covering the ridge region, the first and the second trench regions with an insulating material; and
   forming a first via contacting the first region and a second via contacting the second region.

17. The method of claim 15, wherein the embedded epitaxial region comprises a silicon germanium region and the remaining portion of the first portion comprise a silicon region, wherein the silicon germanium region and the silicon region contact the second region to form a vertical PN junction.

18. The method of claim 15, wherein the embedded epitaxial region extends deeper into the first portion than a bottom surface of the first trench.

19. The method of claim 15, wherein forming the cavity comprises:
   forming a hard mask layer and patterning the hard mask layer to form an opening; and
   etching the first portion exposed by the opening to form the cavity with vertical sidewalls.

20. The method of claim 15, wherein a sidewall of the cavity contacts a sidewall of the first trench.

* * * * *